United States Patent [19]

Sonderman et al.

[11] 4,277,780
[45] Jul. 7, 1981

[54] SCAN-CONTROLLED KEYBOARD

[75] Inventors: Ed L. Sonderman; Walter Z. Davis, both of Spokane, Wash.

[73] Assignee: Key Tronic Corporation, Spokane, Wash.

[21] Appl. No.: 121,902

[22] Filed: Feb. 15, 1980

[51] Int. Cl.³ .................................. G06F 3/02
[52] U.S. Cl. ......................... 340/365 S; 340/365 R
[58] Field of Search ........... 340/365 R, 365 S, 365 E; 178/17 C; 179/90 K; 364/200, 900, 709; 400/479, 472

[56] References Cited

U.S. PATENT DOCUMENTS

| | | | |
|---|---|---|---|
| 3,928,847 | 12/1975 | Spence | 340/365 E |
| 3,978,474 | 8/1976 | Engstrom | 340/365 E |
| 4,106,011 | 8/1978 | Melanson et al. | 340/365 E |
| 4,163,222 | 7/1979 | Gove | 340/365 S |
| 4,170,768 | 10/1979 | Kitagawa | 340/365 S |

Primary Examiner—James J. Groody
Attorney, Agent, or Firm—Wells, St. John & Roberts

[57] ABSTRACT

A keyboard having a matrix arrangement of analog keyswitches arranged along column conductors leading from a driver chip and row conductors leading to a detector chip. The driver chip has a strobe line and multiple address lines adapted to connect to a controller. The column conductors are sequentially pulsed by the driver chip. The detector chip has a strobe line common to that of the driver chip and a multiple line data bus for directing keyboard signals simultaneously from the several row columns.

15 Claims, 6 Drawing Figures

SCAN-CONTROLLED KEYBOARD

BACKGROUND OF THE INVENTION

This invention relates to a keyboard structure that is adapted to be scan-controlled by an external digital controller or processor, such as a microprocessor. The keyboard might include a matrix of any form of analog keyswitches specifically illustrated in this detailed description as capacitive keyswitches activated individually by depression of manual keytops. A capacitive pad on each keyswitch overlays etched capacitive plates arranged in pairs on a printed circuit board. As the keytop is depressed, its pad capacitively couples the etched plates, thereby completing an electrical circuit including the paired plates.

Other forms of analog keyswitches might be utilized in the keyboard matrix, depending upon the details of a specific installation. Analog switches in general are electrical switches that produce a variable signal in the form of current, voltage or charge when actuated. The amplitude of the signal varies in general with switch travel. In the case of a capacitive switch it varies with the degree of separation between the movable capacitor element and the stationary capacitor elements. This is contrasted with mechanical switches, which are normally of a resistive contact type having a well defined open or closed state. The detection of analog switch actuation, using an economical arrangement of integrated circuits adapted to interface with controller or processor circuits, is the subject of this disclosure.

One object of the present design is to make efficient use of the processor circuits by enabling the entire keyboard matrix to be interrogated very rapidly. This requires simultaneous examination of more than one key, ruling out the known methods of using decoders and multiplexers in a synchronous "one key at a time" interrogation system. The chosen solution is a bus-oriented processor interface circuit in the form of integrated circuit chips. For maximum economy in relation to the usual size requirements of alphanumeric keyboards, two chips are utilized in the interface circuitry, each being packaged as a twenty pin part.

The present keyboard does not require a dedicated controller, although a controller can be incorporated on the keyboard if desired. The present system permits an external controller to be used for substantial functions other than keyboard operation, reducing total cost and equipment needs. It requires only a small fraction of the total operating capability of available microcomputer devices for keyboard-related functions in scanning and validating keyswitch use.

The resulting keyboard is extremely simple in both design and structure. The circuit board requires only the presentation of the etched plates and the usual conductors leading from them to the two integrated circuit chips. Ground line isolation is utilized in the matrix layout to keep the inactive keyswitch capacitance as low as possible, but ground line isolation is not required to the extent necessary in previous keyboards. It is also shown to be practical to design the keyboard in a manner that eliminates the requirement for external termination or biasing networks on the matrix lines. Such networks have become a common part of most capacitive switch designs and the keyboards utilizing them.

DESCRIPTION OF A PREFERRED EMBODIMENT

General Discussion

This disclosure relates to a keyboard provided with a series of manually actuated analog switches arranged in a matrix having a plurality of columns (X0 through X11) and a plurality of intersecting rows (Y0 through Y7).

Since the keyboard was designed to include a bus-oriented processor interface circuit for a typical controller, an 8 bit system was used, allowing examination of 8 keys at a time along the rows. However, it is to be understood that the disclosure is not limited to a specific number of columns or rows. The general arrangement of the keyboard matrix shall be referred to as having M columns and N rows, both M and N being integers greater than one.

For purposes of this disclosure, reference will be made to binary signals or pulses applied to lines and terminals of the described circuitry. A line or terminal shall be referred to as being either driven "high" (logic 1) or "low" (logic 0). In a practical example, logic 1 might be at a level of +5.0 volts and logic 0 at 0.0 volts or ground potential.

Figure 1:
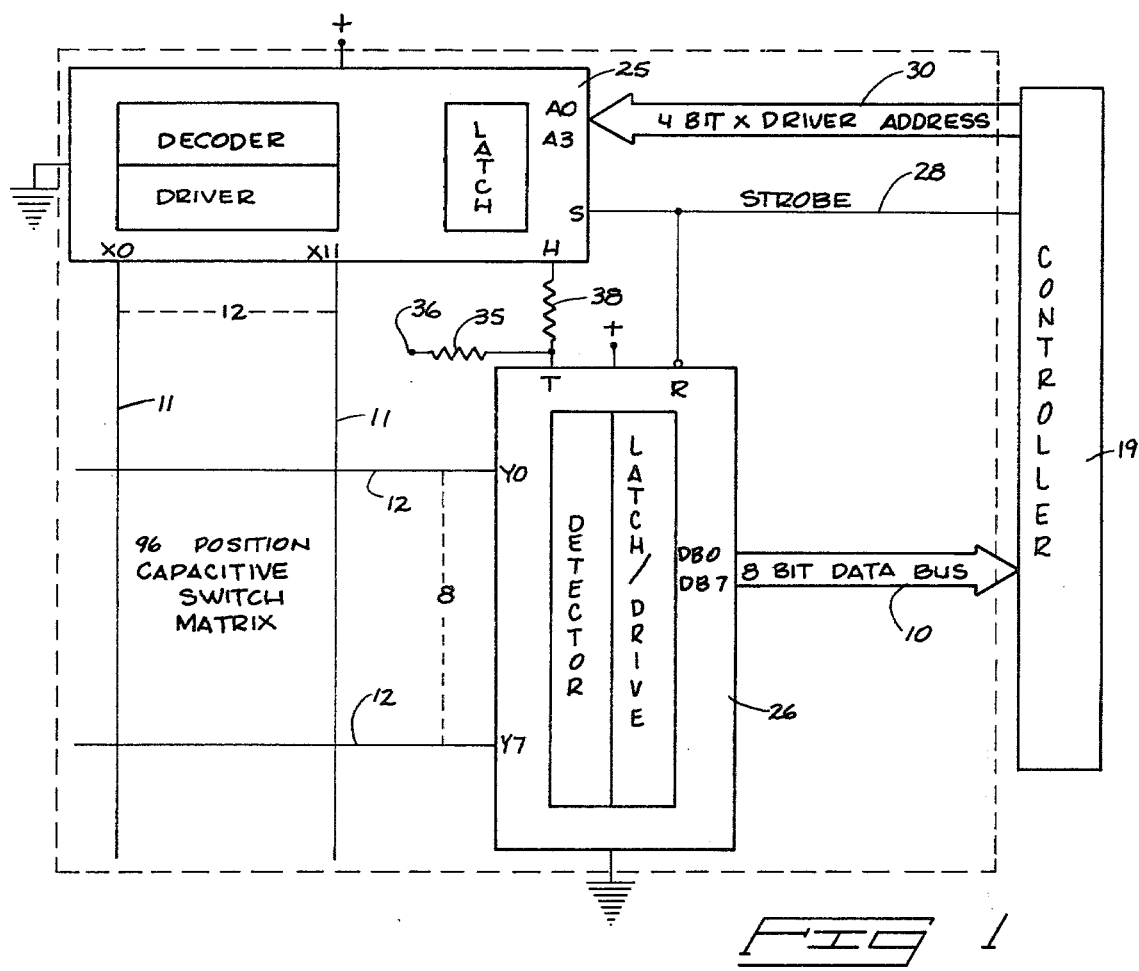
FIG. 1 is a block diagram of the keyboard.

The keyboard, shown within dashed lines at 9 in FIG. 1, is adapted to be scan-controlled by a digital controller 19 directly connected to the keyboard. Digital controller 19 might be in the form of a microprocessor, a computer or a sequential logic system, and will typically be used for other functions in addition to keyboard operations. The controller 19 will normally be external or remote from the keyboard, but can be "on board" or dedicated to keyboard functions when required. The digital controller typically would have a data bus with at least N input terminals, a keyboard scan set and reset strobe for generating a strobe pulse, and address outputs for transmitting a selected binary code to interrogate at least M keyboard conductors. An example of a suitable controller would be an Intel 8048 or similar microprocessor.

The keyboard matrix graphically shown in FIG. 1 can be described generally as having M column conductors 11 in the vertical direction. Each column 11 intersects N row conductors 12 arranged in the horizontal direction. The arrangement of conductors in the actual printed circuit board of a keyboard will not be a precise rectangular matrix, but the electrical connections to the various keyswitch locations will be functionally arranged as illustrated.

Keyswitch Details

The keyboard example illustrated in the drawings includes a plurality of manually activated analog keyswitches 13 which are shown as capacitive switches.

Figure 3:
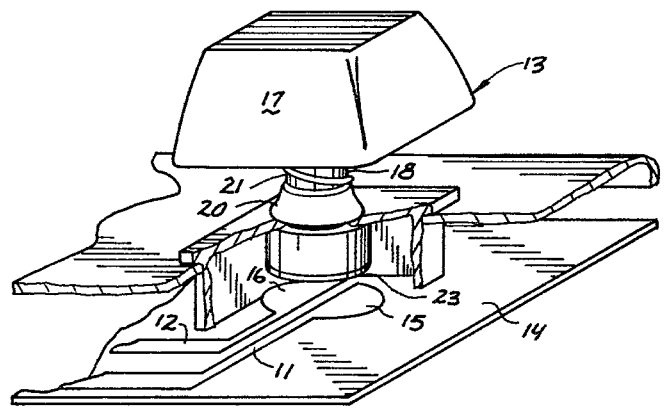
FIG. 3 is a fragmentary perspective view illustrating a typical capacitive switch design.

Each is physically arranged across a separate intersection of one column 11 and one row conductor 12 for selectively completing an electrical circuit across such intersection. Each of these intersections on the actual printed circuit board 14 (FIG. 3) includes a plate 15 leading to a column conductor 11 and an adjacent spaced plate 16 leading to the intersecting row conductor 12. Plates 15 and 16 are etched on the board 14 integrally with the conductors 11 and 12.

The keyswitch 13 may be actuated by manual depression of a keytop 17 fixed to the upper end of a plunger 18 that is slidably mounted within a surrounding switch housing 20. The keytop 17 is biased to a raised position by a light compression spring 21 that surrounds plunger 18.

Figure 2:
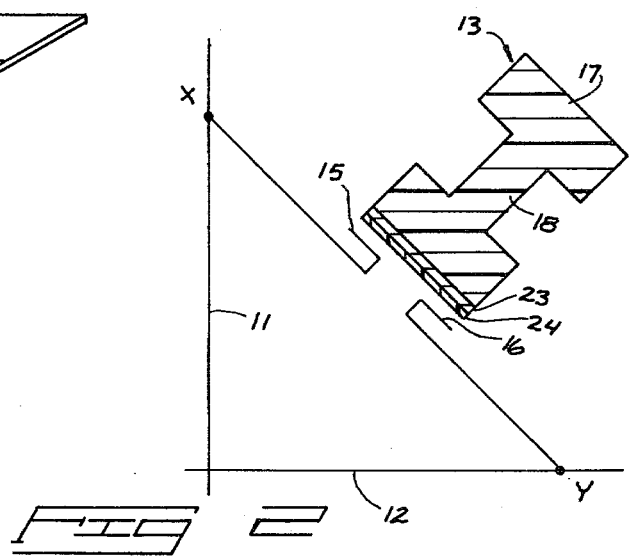
FIG. 2 is a schematic view of a single capacitive keyswitch.

The lower end of the plunger 18 mounts a layer of conductive film 23, preferably coated by a layer of dielectric 24 or other electrically non-conductive material. The layer of dielectric might alternatively be located directly on the plates 15 and 16. As can be seen in FIG. 2, when the keyswitch 12 is depressed, the column conductor 11 and row conductor 12 have an electric circuit completed across them by the capacitance developed between the two plates 15, 16 and the electrically insulated layer of conductive film 23.

Interface Circuitry

According to this disclosure, the interface circuitry integral with the keyboard comprises a driver chip 25 and a detector chip 26. These chips are each single multi-terminal integrated circuits, which can be designed in industry-efficient twenty pin packages, using a single ended power supply.

In general, the function of the driver chip 25 is to receive and latch a four bit address which indicates which X line or column conductor 11 is to be interrogated. The detector chip 26 accepts eight capacitive matrix row conductors 12 as inputs and develops eight output signals which indicate the status of the eight keys being interrogated simultaneously. The strobe line 28 latches the address data into the driver chip 25 and resets the latches 33 within the detector chip 26.

Detector

The detector chip 26 has N input terminals (shown as Y0 through Y7) connected directly to the individual row conductors 12 of the keyboard matrix. It also includes an identical number of output terminals DB0 through DB7, adapted to be individually connected to a corresponding number of lines in the data bus 10 leading to the digital controller.

Since the detector chip 26 was designed as a bus-oriented processor interface chip, this led directly to use of an eight bit system to match present industry standards and allowed examination of eight keys simultaneously. Chip 26 provides latched data onto the output bus 10. Chip 26 has one pin T dedicated to set the threshold current of the detectors within the chip 26, another pin R for a latch reset/output enable terminal to a strobe line 28, two pins for power and sixteen terminals used as input and output terminals. This enables the integrated circuit chip 26 to be produced as a standard twenty pin package.

Figure 4:
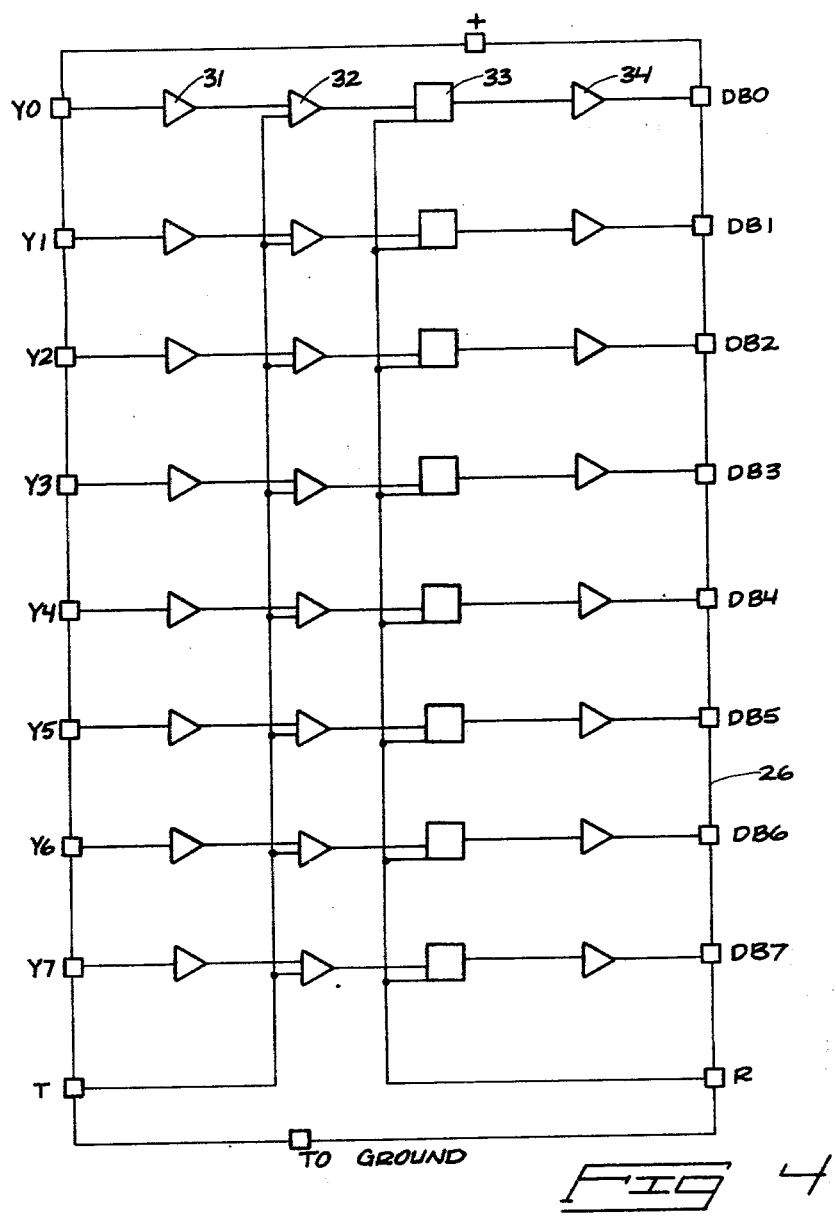
FIG. 4 is a schematic circuit diagram of the detector chip.

As shown in FIG. 4 the detector chip 26 includes eight detector circuits each having a current to voltage converter 31 leading to a voltage threshold detector 32, which in turn is connected by a latch 33 to an output driver 34. The voltage threshold detector 32 of each circuit is connected in common to the threshold terminal T which in turn has a biasing resistor 35 leading to a power source connection at 36. The biasing resistor 35 sets the initial threshold for detection of current through each keyswitch 13 along a row conductor 12. The individual current sensing means provided within detector chip 26 for each of its paired input and output terminals detects an initial current pulse applied on a row conductor 12 of the keyboard matrix above the preselected threshold value and generates a digital signal at its output terminal.

The detector chip 26 has the capability of receiving eight capacitive keyboard matrix analog signals into low input impedance current detectors. It will latch a low signal level on the respective output terminal DB0 to DB7 if the predetermined initial threshold current on a given row conductor 12 is exceeded. All of the detector output terminals DB0 through DB7 are reset high when the reset or strobe line 28 is pulled to ground. They will remain high as long as the signal on the strobe 28 is low. The threshold current for all eight detectors 32 is adjustable by suitable selection of a single external resistor 35 connected between the pin T and the power supply.

Driver

In general terms, the drive chip 25 has M output terminals (shown specifically as X0 through X11) connected directly to M column conductors 11 of the keyboard matrix. It also has a strobe terminal S and a plurality of address terminals (shown as A0 through A3) adapted to be connected to the appropriate outputs of a digital controller.

The driver chip 25 is also packaged as a twenty pin part. Four terminals A0 through A3 connect to four address lines shown generally at 30. The chip also includes a strobe terminal S, a latched output H which serves as a special function terminal, two terminals for power connections and twelve pins X0 through X11, usable as terminals from internal matrix drivers.

The chip 25 has internal decoding means for selecting a column conductor 11 corresponding to an address code received at its address terminals A0 through A3 and stored internally. The interconnection between the selected column conductor 11 and a row conductor 12 provided by the capacitance of an activated keyswitch 13 will cause a current pulse to be applied on each row conductor 12 having a keyswitch 13 activated across an intersection with the selected column conductor 11 on the keyboard matrix. The timing of each pulse on row conductors 12 is controlled in a timed relation to a strobe pulse received at the strobe terminal S from the previously described strobe line 28. See FIG. 5.

Table 1 illustrates a truth table for a twelve column keyboard matrix.

TABLE 1

| Status Prior to Strobe | | | | Status after Strobe | | | | | | | | | | | | |
|---|---|---|---|---|---|---|---|---|---|---|---|---|---|---|---|---|
| A3 | A2 | A1 | A0 | X0 | X1 | X2 | X3 | X4 | X5 | X6 | X7 | X8 | X9 | X10 | X11 | H |
| 0 | 0 | 0 | 0 | 0 | 0 | 0 | 0 | 0 | 0 | 0 | 0 | 0 | 0 | 0 | 0 | * |
| 0 | 0 | 0 | 1 | 0 |   | 0 | 0 | 0 | 0 | 0 | 0 | 0 | 0 | 0 | 0 | * |

TABLE 1-continued

| Status Prior to Strobe | | | | Status after Strobe | | | | | | | | | | | | |
|---|---|---|---|---|---|---|---|---|---|---|---|---|---|---|---|---|
| A3 | A2 | A1 | A0 | X0 | X1 | X2 | X3 | X4 | X5 | X6 | X7 | X8 | X9 | X10 | X11 | H |
| 0 | 0 | 1 | 0 | 0 | 0 |   | 0 | 0 | 0 | 0 | 0 | 0 | 0 | 0 | 0 | * |
| 0 | 0 | 1 | 1 | 0 | 0 | 0 |   | 0 | 0 | 0 | 0 | 0 | 0 | 0 | 0 | * |
| 0 | 1 | 0 | 0 | 0 | 0 | 0 | 0 |   | 0 | 0 | 0 | 0 | 0 | 0 | 0 | * |
| 0 | 1 | 0 | 1 | 0 | 0 | 0 | 0 | 0 |   | 0 | 0 | 0 | 0 | 0 | 0 | * |
| 0 | 1 | 1 | 0 | 0 | 0 | 0 | 0 | 0 | 0 |   | 0 | 0 | 0 | 0 | 0 | * |
| 0 | 1 | 1 | 1 | 0 | 0 | 0 | 0 | 0 | 0 | 0 |   | 0 | 0 | 0 | 0 | * |
| 1 | 0 | 0 | 0 | 0 | 0 | 0 | 0 | 0 | 0 | 0 | 0 |   | 0 | 0 | 0 | * |
| 1 | 0 | 0 | 1 | 0 | 0 | 0 | 0 | 0 | 0 | 0 | 0 | 0 |   | 0 | 0 | * |
| 1 | 0 | 1 | 0 | 0 | 0 | 0 | 0 | 0 | 0 | 0 | 0 | 0 | 0 |   | 0 | * |
| 1 | 0 | 1 | 1 | 0 | 0 | 0 | 0 | 0 | 0 | 0 | 0 | 0 | 0 | 0 |   | * |
| 1 | 1 | 0 | 0 | 0 | 0 | 0 | 0 | 0 | 0 | 0 | 0 | 0 | 0 | 0 | 0 | * |
| 1 | 1 | 0 | 1 | 0 | 0 | 0 | 0 | 0 | 0 | 0 | 0 | 0 | 0 | 0 | 0 | * |
| 1 | 1 | 1 | 0 | 0 | 0 | 0 | 0 | 0 | 0 | 0 | 0 | 0 | 0 | 0 | 0 | 1 |
| 1 | 1 | 1 | 1 | 0 | 0 | 0 | 0 | 0 | 0 | 0 | 0 | 0 | 0 | 0 | 0 | 0 |

1 = Logic High
0 = Logic Low
* = No Change in H Status

The interface from the controller 19 to driver chip 25 includes the four address/command lines 30 over which address data is loaded into chip 25 and the strobe line 28 which clocks the address data into chip 25 on its rising edge.

The driver chip 25 has the capability of interfacing directly to a microprocessor or other controller and receiving commands that indicate which of its output is to be activated. It interfaces directly to the capacitive keyboard matrix and drives the single required X line or column conductor 11.

Interrogation Routine

Figure 5:
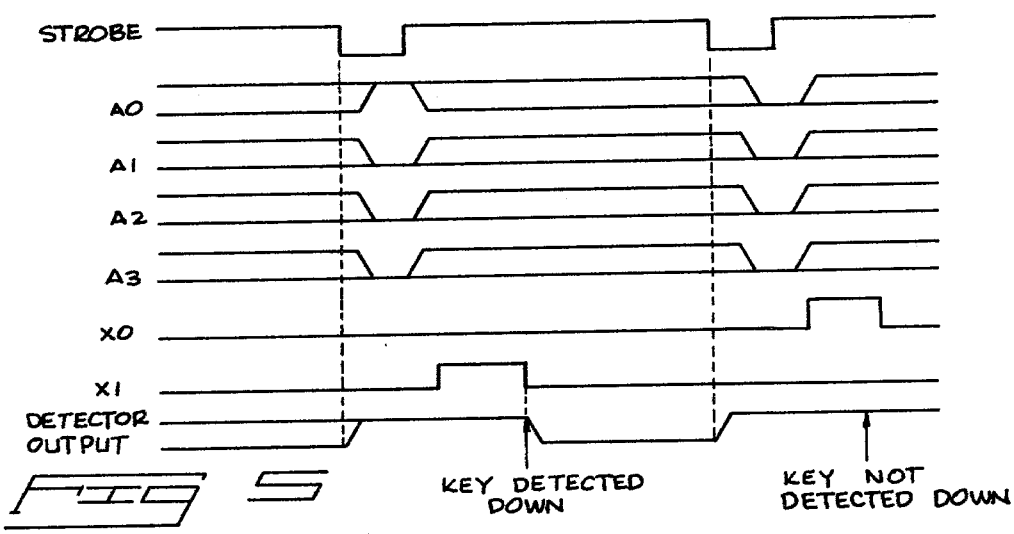
FIG. 5 is a schematic time chart of an interrogation routine.

The chip 25 handles all commands from the controller or microprocessor to the capacitive keyboard matrix. The illustrated example shown in FIG. 1 includes twelve normally low X drive lines or column conductors 11 (X0 through X11), one of which is pulsed high after the rising edge of the strobe line 28 (FIG. 5). The column conductor 11 addressed in a given cycle will be set high and then driven low no longer than 3 $\mu$s after the rising edge of the strobe. The falling edge of the signal applied to the selected column conductor 11 will actually interrogate the capacitive matrix.

As illustrated in FIG. 5, the following sequence of events is carried out in a typical matrix interrogation. First, the strobe line 28 is set to logic low, thereby disabling the detector outputs. Four bits of information are then loaded into the appropriate address lines 30, indicating which column conductor 11 is to be interrogated. The strobe line 28 is then set to logic high, which latches the address into the decoder circuitry of driver chip 25. The decoder then selects the appropriate column conductor 11 and drives it to a logic high. After an internally created delay has expired, the interrogated column conductor 11 is driven to a logic low. This high to low transistion (1 to 0) causes a current pulse on each Y sense line or row conductor 12 that has a keyswitch 13 closed in common with the driven X line or column conductor 11. The detector chip 26 senses these current pulses and sets each corresponding latched output DB0 through DB7 to a logic 0. The status of the eight keyswitches on the interrogated column conductor 11 can now be read from the data bus 10 by a properly programmed controller.

Chip 25 has its output terminals X0 through X11 actively held at ground potential while in their unselected state. This provides increased isolation between matrix conductors on circuit board 14 and minimizes need for ground line isolation. In actual practice, ground lines can be eliminated between the column drivers. In the case of a keyboard using capacitive switches, which operate at capacitive values so small that these values might be developed unintentionally between adjacent matrix conductors, it is desirable to assure isolation by use of ground lines between the X and Y lines on the circuit board 14.

Expanded Keyboard

The keyboard matrix described above, having twelve column conductors 11 and eight row conductors 12, has ninety-six keyswitch positions. Experience has shown that this matrix size will accomodate the majority of alphanumeric data input keyboard terminal requirements.

It will be readily perceived that multiples of this matrix can be provided by adding a second driver chip (not shown) to an expanded keyboard matrix having additional columns or X-lines.

Figure 6:
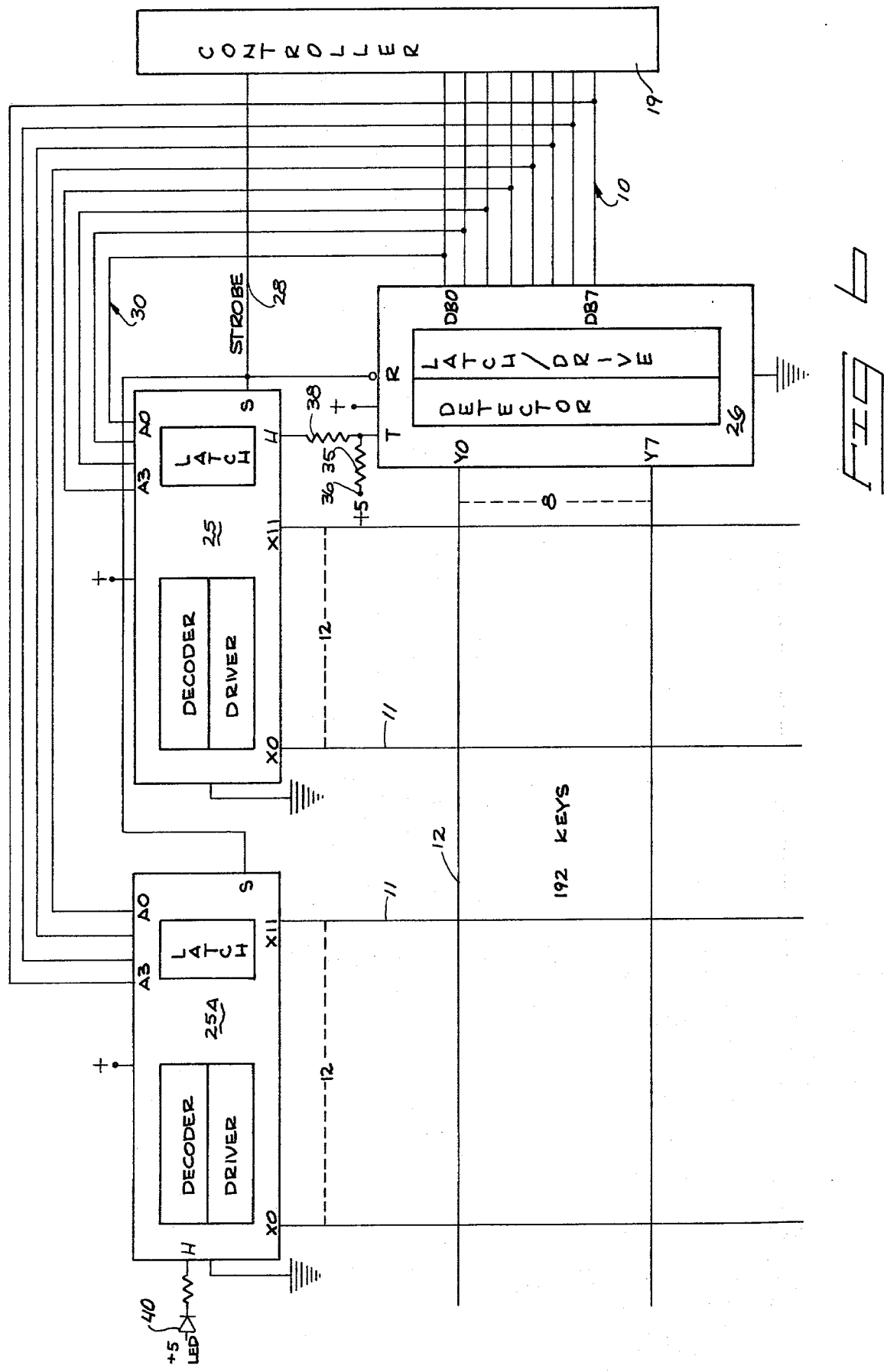
FIG. 6 is a block diagram of an expended keyboard.

FIG. 6 illustrates an expanded keyboard with a matrix of up to 192 keyswitch positions. It also illustrates the manner by which address lines 30 can be operated in a quasibidirectional mode in common with the lines within data bus 10. This arrangement can be incorporated in either the basic or expanded form of the keyboard to permit keyboard scanning by nine line connections to controller 19 (eight line data bus 10, plus strobe line 28). This mode is made possible because the normal output signals at terminals DB0 through DB7 on chip 26 are passively held high when not actively driven. The lines within data bus 10 serve the double purpose of being address lines to chip 25 and data lines from chip 26.

In the keyboard shown in FIG. 5, two driver chips 25 are utilized. They are identical to one another. All identical elements common to the FIG. 1 embodiment are identified by the numerals and letters previously discussed.

The second driver chip 25A has its strobe terminal S also connected to strobe line 28 in common with terminal S of chip 25. When the controller is addressing a selected one of the chips 25 or 25A, the other is supplied with an unused address (see Table 1) so as to eliminate unwanted column signals due to the common strobe signal that will be applied to it.

Where controller capacity permits, the keyboard might also be enlarged by adding a second detector chip 26 driven from a single driver chip 25. The data bus 10 would then include 16 lines to the controller or utilize a common 8 bit bus between them with separate strobe lines.

Special Function Terminal

The chip 25 further includes a single special function driver terminal H which can be used for operation of an external light emitting diode to indicate to the keyboard operator the internal status of the controller special functions, such as shift lock. Terminal H can alternatively be used for controlling other equipment. As shown in Table 1 the terminal H is turned on when address 1111 is strobed into the driver chip 25. Similarly, terminal H will be turned off when address 1110 is strobed into chip 25.

The special function terminal H of the driver chip 25 can be multiplexed to provide several control functions desirable in a keyboard operation. One of these functions is to modify the threshold of the detectors to produce keyswitch hysteresis. The sensitivity of the keyswitches 13 can be changed by modifying the biasing resistance applied to the Terminal T of detector chip 26 by interposing an additional resistance 38 from terminal T of chip 26 to terminal H of chip 25 (FIG. 1). Keyswitches 13 being interrogated by the controller which have not previously been validated or processed would require low sensitivity. This is done by commanding address 14 (1110) to the driver chip 25. Keyswitches being interrogated that have been previously validated or processed would require the electrical signal applied to terminal T to be set low for high sensitivity when being processed as released keys. This is done by commanding address 15 (1111) to the driver chip 25. The same commands can also be used in a multiplexing arrangement for controlling the previously mentioned LED.

When two driver chips 25 are included on the keyboard, as shown in FIG. 6, the special function terminals H can be separately addressed by the controller 19 and can perform separate functions. As shown, chip 25 includes a connection to the biasing resistance 38 which provides keyswitch hysteresis, while chip 25A has its terminal H in a circuit controlling operation of an indicator light emitting diode 40.

Keyboard Circuitry

Conventional keyboards use a single multiplexed detector that necessitates use of common termination networks providing bias and isolation to maintain unselected rows in the keyboard matrix at predetermined levels. This is unnecessary in the present invention since no multiplexing is used in the detection scheme, which uses a separate detector associated with each row.

In practice, it is possible to totally eliminate termination networks on printed circuit board 14. Biasing circuits can be provided within the design of driver chip 25 as required. The detector chip 26 eliminates their need on the row conductors 12. This greatly simplifies both keyboard design and construction.

Keyboard-Controller Operation

When the present keyboard is used with a microprocessor such as an Intel 8048 microprocessor, a complete ninety-six key interrogation can be accomplished in less than one half millisecond. This is of particular importance where the controller's responsibilities include other functions requiring more process time than that of the keyboard function. However, it is to be understood that the keyboard can be used with a dedicated on-board controller or microprocessor where such capacity is required or where independent keyboard operation is needed.

Using a keyboard standard that requires detection and validation of ten millisecond minimum key closures, if one scan of the keyboard requires one-half millisecond, and validation and output of each new key requires an additional three quarters of a millisecond, the keyboard would be scanned every eight milliseconds for a minimum of one-half and a maximum of two milliseconds (assuming only two new keys down per scan). The simultaneous scanning accomplished through the N line bus 10 allows the processor or controller to be utilized for other functions for more than eighty percent of its operating time.

The keyboard designer can take advantage of this ability to periodically interrogate the keyboard by using a minimum interface keyboard as shown in FIG. 1 and connecting it to the bus of an existing processor in a system already handling other functions. The keyboard detailed herein does not require a dedicated microprocessor to operate the keyboard itself. In multiprocessor systems, the keyboard and other peripheral activities will often share a satellite processor.

The proper programming of the processor for interrogating the row conductors 12 and discriminating between previously operated keyswitches 13 and those newly identified as being activated is well known in this industry and to those skilled in this art. The controller will be programmed to discriminate between these keys in applying the proper biasing resistance for hysteresis control so as to vary the keyswitch sensitivity between initial keyswitch actuation and subsequent validation procedures.

Having described the invention, we claim:

1. A keyboard having a plurality of analog keyswitches arranged in M columns and N rows adapted to be scan controlled by a digital controller directly connected thereto wherein both M and N are integers greater than one and the digital controller has a data bus with at least N lines, a keyboard scan set strobe and a reset strobe for generating strobe pulses, and address outputs for transmitting a selected bit code for interrogating at least M keyboard conductors, said keyboard comprising:

a keyboard matrix having a plurality of column conductors intersecting a plurality of row conductors;

a plurality of manually activated analog keyswitch means each physically arranged across a separate intersection of said column conductors and row conductors for selectively completing an electrical circuit across such intersection;

a single multi-terminal integrated circuit driver chip having M output terminals connected directly to M column conductors of the keyboard matrix, said driver chip also having a strobe terminal and a plurality of address terminals adapted to be connected to outputs of a digital controller;

said driver chip having internal decoding means for selecting a column conductor corresponding to an address code received at its address terminals and stored internally, causing a signal to be applied on each row conductor having a keyswitch means activated across an intersection with the selected column conductor on the keyboard matrix in a timed relation to a strobe pulse received at its strobe terminal;

and a single multi-terminal integrated circuit detector chip having N input terminals individually connected directly to N row conductors of the keyboard matrix and N output terminals adapted to be individually connected to N lines of the data bus of the digital controller, said detector chip also having a reset terminal adapted to be connected to an output of the digital controller;

said detector chip having internal individual current sensing means connected to each of its input terminals for detecting a signal applied on a row conductor of the keyboard matrix and generating a digital pulse in response thereto at its corresponding output terminal.

2. A keyboard as set out in claim 1 wherein the detector chip further comprises:

a threshold terminal common to its individual current sensing means; and biasing means connected to the threshold for determining the minimum value of a signal applied on a row conductor which indicates activation of a keyswitch.

3. A keyboard as set out in claim 1 wherein said driver chip further comprises:

a latched special function output terminal activated upon receipt of a first preselected address code at the address terminals of the driver chip and deactivated upon receipt of a second preselected address code at said address terminals.

4. A keyboard as set out in claim 1 wherein said driver chip further comprises:

a latched special function output terminal activated upon receipt of a first preselected address code at the address terminals of the driver chip and deactivated upon receipt of a second preselected address code at said address terminals said detector chip further comprising:

a threshold terminal common to its individual current sensing means; and first biasing means connected to the threshold terminal for determining the minimum value of a signal applied on a row conductor which indicates activation of a keyswitch;

and second biasing means connected between the special function output terminal of the driver chip and the threshold terminal of the detector chip for determining the minimum value of a signal applied on a row conductor which indicates continued activation of a previously activated keyswitch across an intersection on the keyboard matrix including said row conductor.

5. A keyboard as set out in claim 1 wherein the driver chip includes four address terminals.

6. A keyboard as set out in claim 1 wherein the driver chip includes four address terminals and twelve output terminals.

7. A keyboard as set out in claim 1 wherein the driver chip is a twenty pin chip, the individual pins serving as two power terminals, the strobe terminal, four address terminals, twelve output terminals, and a special function output terminal activated upon receipt of a first preselected code at its address terminals and deactivated upon receipt of a second preselected code at said address terminals.

8. A keyboard as set out in claim 1 wherein the detector chip includes eight input terminals and eight corresponding output terminals.

9. A keyboard as set out in claim 1 wherein the detector chip is a twenty pin chip, the individual pins serving as two power terminals, the strobe terminal, eight input terminals, eight corresponding output terminals, and a threshold terminal common to its individual current sensing means and directly connected to biasing means for determining the minimum value of a current pulse applied on a row conductor which is detectable by said current sensing means.

10. A keyboard as set out in claim 1 wherein the driver chip is a twenty pin chip, the individual pins serving as two power terminals, the strobe terminal, four address terminals, twelve output terminals, and a special function output terminal activated upon receipt of a first preselected code at its address terminals and deactivated upon receipt of a second preselected code at said address terminals;

the detector chip is a twenty pin chip, the individual pins serving as two power terminals, the strobe terminal, eight input terminals, eight corresponding output terminals and a threshold terminal common to its individual current sensing means;

first biasing means connected to the threshold terminal for determining the minimum value of a signal applied on a row conductor which indicates activation of a keyswitch;

and second biasing means connected between the special function output terminal of the driver chip and the threshold terminal of the detector chip for determining the minimum value of a signal applied on a row conductor which indicates continued activation of a previously activated keyswitch across an intersection on the keyboard matrix including said row conductor.

11. A keyboard as set out in claim 1 wherein the driver chip contains all termination circuitry required along the column conductors of the keyboard matrix;

there being no termination circuitry along the row conductors of the keyboard matrix.

12. A keyboard as set out in claim 1 wherein the output terminals of the driver chip are actively held at ground potential when no signal is being applied to the respective column conductor of the keyboard matrix connected thereto; whereby groundwire isolation requirements are minimized about the keyboard matrix.

13. A keyboard as set out in claim 1 wherein the address terminals of the driver chip and the output terminals of the detector chip are adapted to be connected in common with lines in the data bus of a digital controller for operation in a quasi-bidirectional mode.

14. A keyboard as set out in claim 1, further comprising:

a second identical driver chip having its strobe terminal adapted to be connected to the strobe of the digital controller and its address terminals adapted to be connected to additional address outputs of the digital controller;

said second driver chip having its output terminals connected to an additional group of M column conductors of the keyboard matrix intersecting the N row conductors.

15. A keyboard as set out in claim 1, wherein the strobe terminal of the driver chip and the reset terminal of the detector chip are connected to a common line adapted to be connected to an output of a digital controller.

* * * * *